United States Patent
Hirai et al.

(12) United States Patent (10) Patent No.: US 6,794,220 B2
(45) Date of Patent: Sep. 21, 2004

(54) ORGANIC THIN-FILM SEMICONDUCTOR ELEMENT AND MANUFACTURING METHOD FOR THE SAME

(75) Inventors: Katsura Hirai, Tokyo (JP); Satoshi Funayama, Tokyo (JP); Toshiya Eguchi, Tokyo (JP); Naoto Yamamoto, Tokyo (JP)

(73) Assignee: Konica Corporation, Tokyo (JP)

( * ) Notice: Subject to any disclaimer, the term of this patent is extended or adjusted under 35 U.S.C. 154(b) by 5 days.

(21) Appl. No.: 10/230,791

(22) Filed: Aug. 29, 2002

(65) Prior Publication Data

US 2003/0047729 A1 Mar. 13, 2003

(30) Foreign Application Priority Data

Sep. 5, 2001 (JP) .......................................... 2001-269082

(51) Int. Cl.[7] .............................................. H01L 51/40
(52) U.S. Cl. ......................................................... 438/99
(58) Field of Search .............................. 438/99, 22, 57, 438/96, 97, 82

(56) References Cited

U.S. PATENT DOCUMENTS

| | | | | |
|---|---|---|---|---|
| 6,060,338 A | * | 5/2000 | Tanaka et al. ................. | 438/99 |
| 6,207,472 B1 | * | 3/2001 | Callegari et al. .............. | 438/99 |
| 6,284,562 B1 | * | 9/2001 | Batlogg et al. ................ | 438/99 |
| 6,335,539 B1 | * | 1/2002 | Dimitrakopoulos et al. .. | 438/99 |
| 6,506,616 B1 | * | 1/2003 | Kim et al. ..................... | 438/99 |
| 6,569,707 B2 | * | 5/2003 | Dimitrakopoulos et al. .. | 438/99 |
| 6,580,127 B1 | * | 6/2003 | Andry et al. ................ | 257/347 |
| 6,586,791 B1 | * | 7/2003 | Lee et al. .................... | 257/295 |
| 6,593,977 B2 | * | 7/2003 | Ishihara et al. ................ | 349/43 |

* cited by examiner

Primary Examiner—Walter Lee Lindsay, Jr.
(74) Attorney, Agent, or Firm—Frishauf, Holtz, Goodman & Chick, P.C.

(57) ABSTRACT

There is described an organic thin-film transistor including an active layer made of organic semiconductor and a manufacturing method for the organic thin-film transistor. In particular, the invention concerns an organic thin-film transistor capable of being formed on a flexible base board made of a polymer material and a manufacturing method for the same. The organic semiconductor device, includes a drain electrode; a source electrode; a gate electrode; a channel that is made of an organic semiconductor material and is disposed between the drain electrode and the source electrode; and an insulation film that is disposed between the gate electrode and the channel; wherein the insulation film is formed under an atmospheric pressure environment by employing a plasma processing.

17 Claims, 7 Drawing Sheets

FIG. 7 (A)
FORMATION OF S-LINE AND DISPLAY ELECTRODE

FIG. 7 (B)
FORMATION OF ORGANIC SEMICONDUCTOR LAYER

FIG. 7 (C)
FORMATION OF INSULATING LAYER

FIG. 7 (D)
FORMATION OF GATE LINE

ORGANIC THIN-FILM SEMICONDUCTOR ELEMENT AND MANUFACTURING METHOD FOR THE SAME

BACKGROUND OF THE INVENTION

The present invention relates to an organic thin-film transistor including an active layer made of organic semiconductor and to a manufacturing method for the organic thin-film transistor. In particular, the invention relates to an organic thin-film transistor capable of being formed on a flexible base board made of a polymer material and a manufacturing method for the same.

With the spread of information terminals, there are increasing demands for a flat panel display that serves as a display for a computer. Further, with development of the information technology, there has been increased a chance for information offered in a form of a sheet of paper medium in the past to be offered in an electronic form. An electronic paper or a digital paper is demanded increasingly as a display medium for a mobile that is thin, lightweight and handy.

In the case of a display device of a flat sheet type, a display medium is generally formed by using an element that employs a liquid crystal, organic EL or electrophoretic method. In the display medium of this kind, a technology for using an active driving element (TFT element), serving as an image displaying element, is the main current for ensuring uniformity of screen brightness and a screen rewriting speed. For example, in the case of an ordinary computer display, a TFT element is formed on a glass base board, and a liquid crystal or organic EL is sealed.

In this case, a semiconductor such as a-Si (amorphous silicone) or p-Si (poly-silicone) can mainly be used for the TFT element, and these Si semiconductors (including also a metal film if necessary) are multi-layered, and source, drain and gate electrodes are formed on the base board in succession to manufacture the TFT element. The manufacture of the TFT element of this kind usually requires a process of sputtering and other manufacture process of a vacuum system.

On the other hand, recently, organic materials are studied to be used as an active semi-conductive layer in a thin-film transistor (TFT). Since the organic materials can be easily processed, and they have high affinity with a plastic base board on which TFT is formed generally, they are expected to be used as an active semi-conductive layer in a thin-film transistor. Therefore, they are studied as a low cost device having a large area, especially as an active driving element for a display, and there have been disclosed technologies in, for example, TOKKAIHEI No. 10-190001 and TOKKAI No. 2000-307172. In order for the organic semiconductor to be used as an active semiconductive layer in a thin-film TFT, conditions such as an ON/OFF ratio, leakage current, driving voltage of a gate of a device and insulation durability of the gate insulation layer, obtained as final result, need to be satisfied sufficiently.

Figure 9:
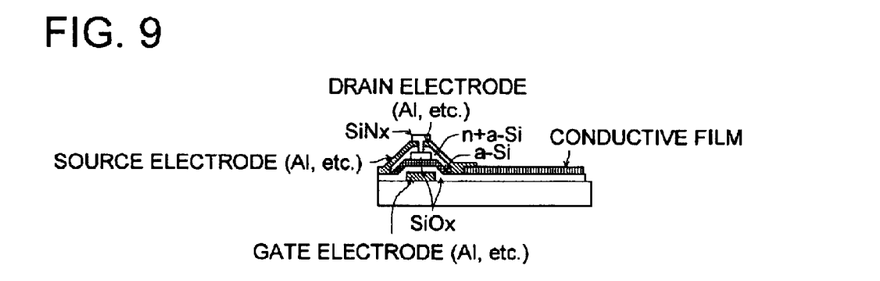
FIG. 9 is a diagram showing how conventional TFT elements each using Si semiconductor are formed on the display panel base board.

However, in the manufacture of the TFT element of this kind, a manufacturing process of a vacuum system including a vacuum chamber needs to be repeated time after time to form various layers, resulting in a large amount of money in facility cost and running cost. For example, in the case of the TFT element shown in FIG. 9, steps of vacuum deposition, doping, photolithography and development need to be repeated time after time for forming various layers, and an element is formed on the base board through several tens of steps. Even for the semiconductor portions representing a vital point of switching operations, semiconductor layers in plural types such as a p-type and an n-type are laminated.

In the conventional manufacturing method employing a Si-semiconductor, drastic design changes in manufacturing apparatus such as vacuum chambers are required for the needs of large-sized display screens, and changes in apparatus are not easy.

Even in the case of a gate-insulating film of a transistor, it has been formed generally with a film of silicone oxide obtained through thermal oxidation of a silicone base board, or with a thin film of oxide obtained through a dry process such as a sputtering method, thus, formation of an insulating film had to rely on the conventional method even when using organic materials as an active semiconductor layer in TFT.

However, in order for the organic semiconductor to be used as an active semi-conductive layer in a thin-film TFT, conditions such as an ON/OFF ratio, leakage current and driving voltage of a gate of a device obtained finally need to be satisfied sufficiently. A practical method for realizing the aforementioned characteristics has not been found sufficiently.

SUMMARY OF THE INVENTION

To overcome the abovementioned drawbacks in conventional organic semiconductor devices, it is an object of the present invention to improve characteristics of organic semiconductor devices and thereby to realize reduction of manufacturing cost and simplification of manufacturing process.

Accordingly, to overcome the cited shortcomings, the abovementioned object of the present invention can be attained by organic semiconductor devices and methods described as follow.

(1) An organic semiconductor device, comprising: a drain electrode; a source electrode; a gate electrode; a channel that is made of an organic semiconductor material and is disposed between the drain electrode and the source electrode; and an insulation film that is disposed between the gate electrode and the channel; wherein the insulation film is formed under an atmospheric pressure environment by employing a plasma processing.

(2) The organic semiconductor device of item 1, wherein the insulation film comprises either oxide compounds or nitride compounds.

(3) The organic semiconductor device of item 2, wherein the insulation film comprises anyone of silicon oxide, aluminum oxide, tantalum oxide and titanium oxide.

(4) The organic semiconductor device of item 2, wherein the insulation film comprises silicon nitride.

(5) The organic semiconductor device of item 1, wherein the organic semiconductor material is π-conjugated polymers.

(6) The organic semiconductor device of item 1, wherein the organic semiconductor device is fabricated on a supporting substrate; and wherein the supporting substrate is a sheet made of a resin material.

(7) The organic semiconductor device of item 6, wherein the sheet is a plastic film.

(8) The organic semiconductor device of item 1, wherein the organic semiconductor device is fabricated on a supporting substrate; and wherein the supporting substrate is made of polymers.

(9) The organic semiconductor device of item 1, wherein the organic semiconductor device is fabricated on a supporting substrate; and wherein sections of the organic semiconductor device are formed in an order of the channel, the insulation film and the gate electrode.

(10) The organic semiconductor device of item 1, wherein the organic semiconductor device is a transistor.

(11) A method for manufacturing an organic semiconductor device, which includes a drain electrode, a source electrode and a gate electrode, comprising the steps of: forming a channel between the drain electrode and the source electrode with an organic semiconductor material; and forming an insulation film, disposed between a gate and the channel, under an atmospheric pressure environment by employing a plasma processing.

(12) The method of item 11, wherein a reactive gas is exited into plasma by a discharging operation under a pressure equivalent or nearly equivalent to an atmospheric pressure to form the insulation film.

(13) The method of item 11, wherein the organic semiconductor device is fabricated on a supporting substrate; and wherein, after the source electrode and the drain electrode are formed on the supporting substrate, a field-effect active layer, made of the organic semiconductor material, is fabricated between them as the channel, and then, the insulation film and the gate electrode are successively formed on the field-effect active layer.

(14) The method of item 11, wherein the organic semiconductor device is fabricated on a supporting substrate; and wherein, after the gate electrode is formed on the supporting substrate, the insulation film is formed so as to cover the gate electrode, and then, the source electrode, the drain electrode and a field-effect active layer, serving as the channel and made of the organic semiconductor material, are successively formed on the insulation film.

(15) The method of item 11, wherein the insulation film comprises either oxide compounds or nitride compounds.

(16) The method of item 15, wherein the insulation film comprises anyone of silicon oxide, aluminum oxide, tantalum oxide and titanium oxide.

(17) The method of item 15, wherein the insulation film comprises silicon nitride.

(18) The method of item 11, wherein the organic semiconductor material is π-conjugated polymers.

(19) The method of item 11, wherein the organic semiconductor device is fabricated on a supporting substrate; and wherein the supporting substrate is a sheet made of a resin material.

(20) The method of item 19, wherein the sheet is a plastic film.

(21) The method of item 11, wherein the organic semiconductor device is fabricated on a supporting substrate; and wherein the supporting substrate is made of polymers.

(22) The method of item 11, wherein the organic semiconductor device is fabricated on a supporting substrate; and further comprising the steps of: forming the source electrode and the drain electrode on the supporting substrate forming the gate electrode on the insulation film.

(23) The method of item 11, wherein the organic semiconductor device is a transistor.

(24) A display panel for displaying an image, comprising: a supporting substrate; and a plurality of organic semiconductor devices formed on the supporting substrate; wherein each of the plurality of organic semiconductor devices comprises: a drain electrode; a source electrode; a gate electrode; a channel that is made of an organic semiconductor material and is disposed between the drain electrode and the source electrode; and an insulation film that is disposed between the gate electrode and the channel; wherein the insulation film is formed under an atmospheric pressure environment by employing a plasma processing.

BRIEF DESCRIPTION OF THE DRAWINGS

Other objects and advantages of the present invention will become apparent upon reading the following detailed description and upon reference to the drawings in which.

DETAILED DESCRIPTION OF THE PREFERRED EMBODIMENT

An embodiment of the invention will be explained in detail as follows.

On a Si-semiconductor material used for an ordinary switching element, there is formed a channel by combining a gate electrode with a source section and a drain section, and ON and OFF of an electric current is controlled between the source section and the drain section. However, the ordinary semiconductor material mentioned above requires facilities for sputtering or vacuum deposition.

On the other hand, elements of the invention are arranged as shown in FIG. 1, for example. Namely, the elements are composed of gate electrode G, gate insulating film I, active layer by an organic semiconductor P, source electrode S and drain electrode D. Each of FIGS. 1(a), 1(b) and 1(c) is an example wherein the gate electrode is arranged to be above the organic semiconductor layer on the supporting substrate (hereinafter referred to as "the support" for simplicity), and FIG. 1(a) represents an example wherein the organic semiconductor layer is arranged between the source electrode and the drain electrode to connect them, FIG. 1(b) represents an example wherein the organic semiconductor layer is arranged to stretch over the source electrode and the drain electrode to cover them and FIG. 1(c) represents an example wherein the organic semiconductor layer is arranged to stretch under the source electrode and the drain electrode to connect them.

Figure 1A:
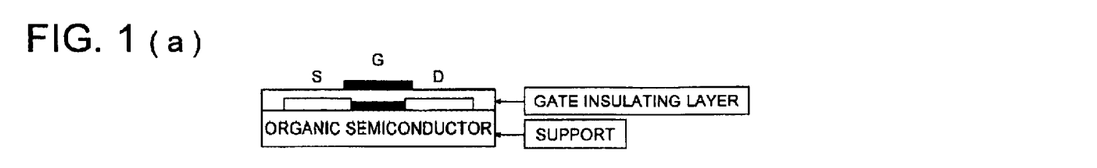
FIG. 1(a), FIG. 1(b), FIG. 1(c), FIG. 1(d), FIG. 1(e) and FIG. 1(f) show exemplified structures of the organic semiconductor devices in each of which the gate electrode is arranged to be above the organic semiconductor layer on the supporting substrate.
Figure 1B:
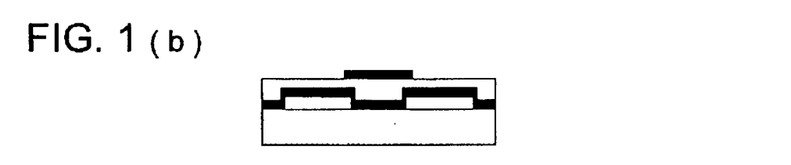
Figure 1C:
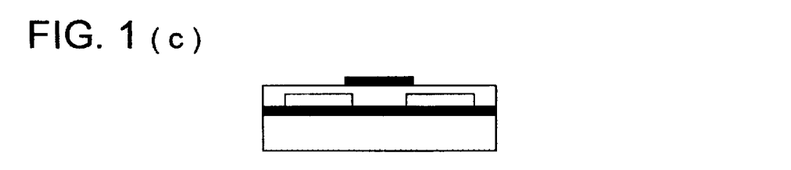
Figure 1D:
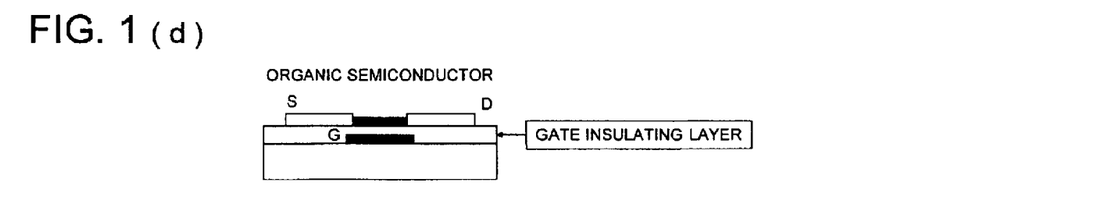
Figure 1E:
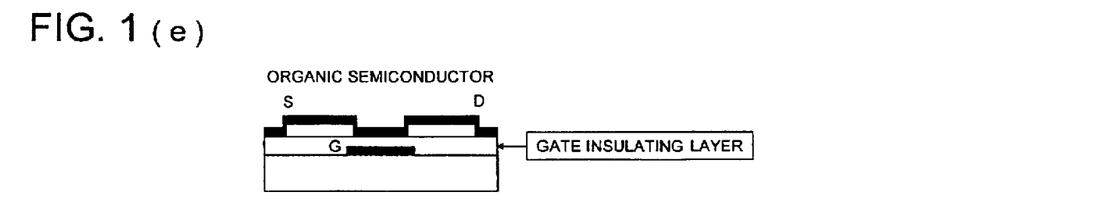
Figure 1F:
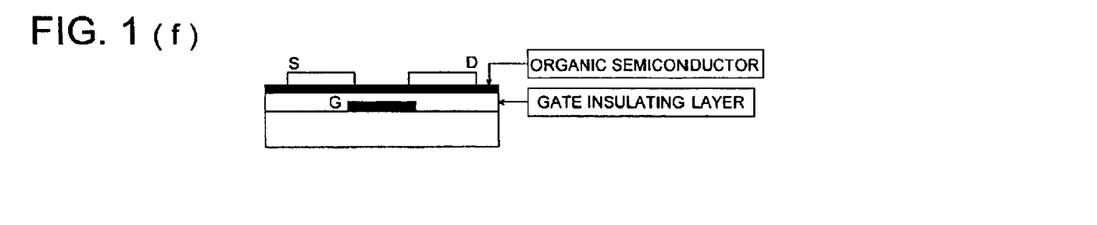

Each of FIGS. 1(d), 1(e) and 1(f) is an example wherein the organic semiconductor layer is arranged to be above the gate electrode on the support. Arrangements of FIGS. 1(d), 1(e) and 1(f) in arrangements of the organic semiconductor layer for the source electrode and the drain electrode correspond to the aforesaid arrangements of FIGS. 1(a), 1(b) and 1(c), and FIG. 1(a) represents an example wherein the organic semiconductor layer is arranged between the source electrode and the drain electrode to connect them, FIG. 1(b) represents an example wherein the organic semiconductor layer is arranged to stretch over the source electrode and the drain electrode to cover them and FIG. 1(c) represents an example wherein the organic semiconductor layer is arranged to stretch under the source electrode and the drain electrode to connect them.

On the other hand, in organic materials, especially in organic semiconductor materials, there have been found some which exhibit specific behavior, but the same arrangement can be taken as arrangement of elements.

For the mounting of elements appropriate to materials for the elements whose materials are organic semiconductor materials, or for application to a display panel, it is difficult to mention at this stage that a sufficient mounting method is established.

Structures, materials and processes for each member will be explained as follows.

<Organic Semiconductor Layer>

Preferably employed as organic semiconductors are π-conjugated polymers. For example, employed may be polypyrroles such as polypyrrole, poly(N-substituted pyrrole), poly(3-substituted pyrrole), and poly(3,4-disubstituted pyrrole); polythiophenes such as polythiophene, poly(3-substituted thiophene), poly(3,4-disubstituted thiophene), and polybenzothiophene; polyisothianaphthenes such as polyisothianaphthene; polythienylenevinylenes such as polythienylenevinylene; poly(p-phenylenevinylenes) such as poly(p-phenylenevinylene); polyanilines such as polyaniline, poly(N-substituted aniline), poly(3-substituted aniline), and poly(2,3-substituted aniline); polyacetylnenes such as polyacetylene; polydiacetylens such as polydiacetylene; polyazulenes such as polyazulene; polypyrenes such as polypyrene; polycarbazoles such as polycarbazole and poly(N-substituted carbazole), polyselenophenes such as polyselenophene; polyfurans such as polyfuran and polybenzofuran; poly(p-phenylens) such as poly(p-phenylene); polyindoles such as polyindole; polypyridazines such as polypyridazine; polyacenes such as naphthacene, pentacene, hexacene, heptacene, dibenzopentacene, tertabenzopentacene, pyrene, dibenzopyrene, chrysene, perylene, coronene, Terylene, ovalene, quoterylene, and circumanthracene; derivatives (such as triphenodioxazine, triphenodithiazine, hexacene-6, 15-quinone) which are prepared by substituting some of carbon atoms of polyacens with atoms such as N, S, and O, or a functional group such as a carbonyl group; polymers such as polyvinylcarbazoles, polyphenylenesulfide, and polyvinylenesulfide; and polycyclic condensation products described in Japanese Patent Publication Open to Public Inspection No. 11-195790. Further preferably employed may be oligomers having the same repeating units as said polymers such as thiophene hexamers including α-sexithiophene α, ω-dihexyl-α-sexithiophene, α,ω-dihexyl-α-quiinquethiophene, α,ω-bis(3-butoxypropyl)-α-sexithiophene, and styrylbenzene derivatives. Further, listed are metal phthalocyanines such as copper phthalocyanine, and fluorine-substituted copper phthalocyanines, described in Japanese Patent Publication Open to Public Inspection No. 11-251601; condensed cyclic tetracarboxylic acid diimides including naphthalenetetracarboxylic acid imides such as 1,4,5,8-teracarboxylic acid diimide, N,N'-bis(4-trifluoromethylbenzyl)naphthalene-1,4,5,8-tretracarboxylic acid diimide, as well as naphthalenetetracarboxylic acid diimides such as N,N'-bis(1H,1H-perfluoroctyl), N,N'-bis(1H,1H-perfluorobutyl) and N,N'-dioctylnaphthalenel,4,5,8-tetracarboxylic acid diimide derivatives, naphthalenetetracarboxylic acid diimides such as naphthalene-2,3,6,7-tetracarboxylic acid diimides; anthracenetetracarbocylic acid diimides such as anthracene-2,3,6,7-tetracarboxylic acid diimides; fullerenes such as $C_{60}$, $C_{70}$, $C_{76}$, $C_{78}$, and $C_{84}$; carbon nanotube such as SWNT; and dyes such as merocyanines and hemicyanines.

Of said π conjugated compounds, preferably employed is at least one selected from the group consisting of thiophene, vinylene, thienylenevinylene, phenylenevinylene, p-phenylene, substitution products thereof, oligomers which have at least two of these as a repeating unit and have the number n of repeating units of 4 to 10 or polymers which have the number n of said repeating units of at least 20, condensed polycyclic aromatic compounds such as pentacene, fullerenes, condensed cyclic tetracarboxylic acid diimides, and metal phthalocyanines.

Further, employed as other organic semiconductors may be organic molecular complexes such as a tetrathiafulvalene (TTF)-tetracyanoquinodimethane (TCNQ) complex, a bis-ethylenetetrathiafulvalene (BEDTTTF)-perchloric acid complex, a BEDTTTF-iodine complex, and a TCNQ-iodine complex. Still further, employed may be σ conjugated system polymers such as polysilane and polygermane, as well as organic-inorganic composite materials described in Japanese Patent Publication Open to Public Inspection No. 2000-260999.

In the present invention, the organic semiconductor layer may be subjected to a so-called doping treatment by incorporating in said layer, for example, acrylic acid, acetamide, materials having a functional group such as a dimethylamino group, a cyano group, a carboxyl group and a nitro group, materials such as benzoquinone derivatives, and tetracyanoethylene as well as tetracyanoquinodimethane, and derivatives thereof, which work as an acceptor which accepts electrons, or, for example, materials having a functional group such as an amino group, a triphenyl group, an alkyl group, a hydroxyl group, an alkoxy group, and a phenyl group; substituted amines such as phenylenediamine; anthracene, benzoanthracene, substituted benzoanthracenes, pyrene, substituted pyrene, carbazole and derivatives thereof, and tetrathiafulvalene and derivatives thereof, which work as a donor which is an electron donor.

The doping, as described herein, means that electron accepting molecules (acceptors) or electron donating molecules (donors) are incorporated in said thin film employing doping. Accordingly, the thin film, which has been subjected to said doping, is one which comprises said condensed polycyclic aromatic compounds as well as dopants. Employed as dopants used in the present invention may be either acceptors or donors. Listed as said acceptors may be halogens such as $Cl_2$, $Br_2$, $I_2$, ICl, $ICl_3$, IBr, and IF; Lewis acids such as $PF_5$, $AsF_5$, $SbF_5$, $BF_3$, $BCl_3$, $BBr_3$, and $SO_3$; protonic acids such as HF, HCl, $HNO_3$, $H_2SO_4$, $HClO_4$, $FSO_3H$, $ClSO_3H$, and $CF_3SO_3H$; organic acids such as acetic acid, formic acid, and amino acid; transition metal compounds such as $FeCl_3$, FeOCl, $TiCl_4$, $ZrCl_4$, $HfCl_4$, $NbF_5$, $NbF_5$, $NbCl_5$, $TaCl_5$, $MoCl_5$, $WF_5$, $WCl_5$, $UF_6$, $LnCl_3$ (Ln=lanthanoid such as La, Ce, Nd, and Pr, and Y), and electrolyte anions such as $Cl^-$, $Br^-$, $I^-$, $ClO^{4-}$, $PF^{6-}$, $AsF^{5-}$, $SbF_6^-$, $BF_4^-$, and a sulfonate anion. Further, listed as donors may be alkaline metals such as Li, Na, K, Rb, and Cs; alkaline earth metals such as Ca, Sr, and Ba; rare earth metals such as Y, La, Ce, Pr, Nd, Sm, Eu, Gd, Tb, Dy, Ho, Er, and Yb; an ammonium ion; $R_4P^+$, $R_4AS^+$, and $R_3S^+$; and acetylcholine. Doping these dopants may be carried out employing either a method in which a thin organic semiconductor film is prepared and subsequently, said dopants are incorporated, or a method in which dopants are incorporated during preparation of a thin semiconductor film. Listed as former methods may be a gas phase doping in which gaseous dopants are employed, and a liquid phase doping in which doping is carried out while said thin film comes into contact with a dopant solution or liquid dopants. Further, in said liquid phase doping, it is possible to adjust the doping efficiency utilizing electrolysis. In the latter methods, either a solution or a dispersion, consisting of organic semiconductors and dopants, may be coated and subsequently dried. For instance, when a vacuum deposition method is used, dopants may be incorporated by achieving co-deposition of semiconductor compounds together with dopants. Further, when a thin film is prepared employing a sputtering method, dopants may be incorporated in said thin film through sputtering, utilizing the two-dimensional target of said organic semiconductors and said dopants. Still further, as other methods, it is possible to use any of the chemical doping such as electrochemical doping or photo-initiation doping, or the physical doping such as an ion injection method shown in, for example, a publication "Kogyo Jairyo (Industrial Materials)", Volume 34, No. 4, page 55 (1986).

Listed as methods for preparing said thin organic films are a vacuum deposition method, a molecular beam epitaxial growth method, an ion cluster beam method, a low energy ion beam method, an ion plating method, a CVD method, a sputtering method, a plasma polymerization method, an electrolytic polymerization method, a chemical polymerization method, a spray coating method, a spin coating method, a blade coating method, a dip coating method, a casting method, a roll coating method, an bar coating method, a die coating method, and an LB method, which may be employed based on materials. However, of these, from the viewpoint of productivity, a spin coating method, a blade coating method, a dip coating method, a roll coating method, a bar coating method, and a die coating method are preferred which can simply and accurately form a thin film employing an organic semiconductor solution. The thickness of the thin film comprised of said organic semiconductors is not particularly limited. However, since the characteristics of the resultant transistors often vary depending on the thickness of the active layer comprised of organic semiconductors, the thickness varies depending on the organic semiconductors, but is commonly at most 1 µm, and is preferably from 10 to 300 nm.

<Electrodes (Source, Drain, and Gate Electrodes)>

Materials for constituting the gate, source, and drain electrodes are not particularly restricted as long as they are electrically conductive materials. Employed as materials are platinum, gold, silver, nickel, chromium, copper, iron, tin, antimony, lead, tantalum, indium, palladium, tellurium, rhenium, iridium, aluminum, ruthenium, germanium, molybdenum, tungsten, tin oxide-antimony, indium oxide-tin (ITO), fluorine-doped zinc oxide, zinc, carbon, graphite, glassy carbon, silver paste as well as carbon paste, lithium, beryllium, sodium, magnesium, potassium, calcium, scandium, titanium, manganese, zirconium, gallium, niobium, sodium, sodium-potassium alloy, magnesium, lithium, aluminum magnesium/copper mixtures, magnesium/silver mixtures, magnesium/aluminum mixtures, magnesium/indium mixtures, aluminum/aluminum oxide mixtures, and lithium/aluminum mixtures. Of theses, specifically preferred are platinum, gold, silver, copper, aluminum, indium, ITO, and carbon. Alternatively, suitably employed are electrically conductive polymers, known in the art, such as electrically conductive polyaniline, electrically conductive polypyrrole, electrically conductive polythiophene, and complexes of polyethylenedioxythiophene and polystyrnesulfonic acid which increase electrical conductivity upon being doped.

Methods for forming electrodes include a method in which an electrode is prepared in such a manner that a photolithographic method or a lift-off method, known in the art, is applied to electrically conductive layer, which has been formed employing a vacuum evaporation or sputtering method while employing the aforesaid compounds as a raw material, and a method in which etching is conducted employing a resist which has been prepared employing thermal transfer or ink jet printing onto a foil of metal such as aluminum or copper. Further, an electrically conductive polymer solution or dispersion, or a minute electrically conductive particle dispersion may be subjected directly to patterning, employing ink jet printing. Said electrode may also be formed in such a manner that a coated layer is subjected to lithograph or laser ablation. In addition, a method may also be employed in which ink comprising either an electrically conductive polymer or minute electrically conductive particles, or electrically conductive paste is subjected to patterning, employing any of the printing methods such as letter press, intaglio printing, lithography, or screen printing.

An electrode is employed which is formed by thermally fusing minute metal particles, having a diameter of 1 to 50 nm, and preferably having a diameter of 1 to 10 nm. Employed as metals may be platinum, gold, silver, nickel, chromium, copper, iron, tin, tantalum, indium, cobalt, palladium, tellurium, rhenium, iridium, aluminum, ruthenium, germanium, molybdenum, tungsten, and zinc. Of these, particularly preferred are platinum, gold, silver, copper, cobalt, chromium, iridium, nickel, palladium, molybdenum, and tungsten, which have a work function of at least 4.5 eV.

Listed as said minute electrically conductive particles, having a diameter of 1 to 50 nm and preferably having from 1 to 10 nm, are minute particles of metals such as platinum, gold, silver, copper, cobalt, chromium, iridium, nickel, palladium, molybdenum, and tungsten. Cited as production methods of such minute metal particle suspension are physical preparation methods such as an in-gas evaporation method, a sputtering method, and a metal vapor synthesis method, and chemical preparation methods such as a colloid method and a coprecipitation method in which metal ions are reduced in a liquid phase so that minute metal particles are formed. Of these, preferred are dispersions which are prepared using the colloid methods described in Japanese Patent Publication Open to Public Inspection Nos. 11-76800, 11-80647, 319538, and 2000-239853 and the in-gas evaporation method described in Japanese Patent Publication Open to Public Inspection Nos. 2001-254185, 2001-53028, 2001-35814, 2001-35255, 2000-124157, and 2000-123634. After coating these dispersions and molding the resultant coating to an electrode-patterned shape, solvents are vaporized. The resultant is further subjected to a thermal treatment at 100 to 300° C. and preferably at 150 to 200° C., whereby an electrode is formed by thermally fusing said minute metal particles.

Incidentally, the gate line as well as the source line may be formed in the same manner as said electrode.

<Gate Insulation Layer>

Various insulation layers may be employed. Of these, layers, which are comprised of silicon oxide, silicon nitride, aluminum oxide, tantalum oxide, or titanium oxide, are particularly preferred. In the present invention, said insulation layer is specifically formed under an atmospheric pressure, employing a plasma layer forming process.

i) Plasma Film Forming Processing Under the Atmospheric Pressure

A forming method of an insulating film (for example, oxide: $SiO_2$, $TiO_2$ etc./nitride: $Si_3N_4$ etc.) by Plasma film forming processing under the atmospheric pressure is explained as follows.

The plasma film forming processing under the atmospheric pressure means a processing wherein a reactive gas is plasma-excited by discharge conducted under the atmospheric pressure or the pressure near the atmospheric pressure and a thin film is formed on the elementb material, and its method is described in TOKKAIHEI No. 11-133205, TOKKAI No. 2000-185362, TOKKAIHEI No. 11-61406 and TOKKAI Nos. 2000-147209 and 2000-121804 (hereinafter referred to also as an atmospheric pressure plasma method). Owing to this, it is possible to form thin films with high functions in the high productivity.

Figure 11:
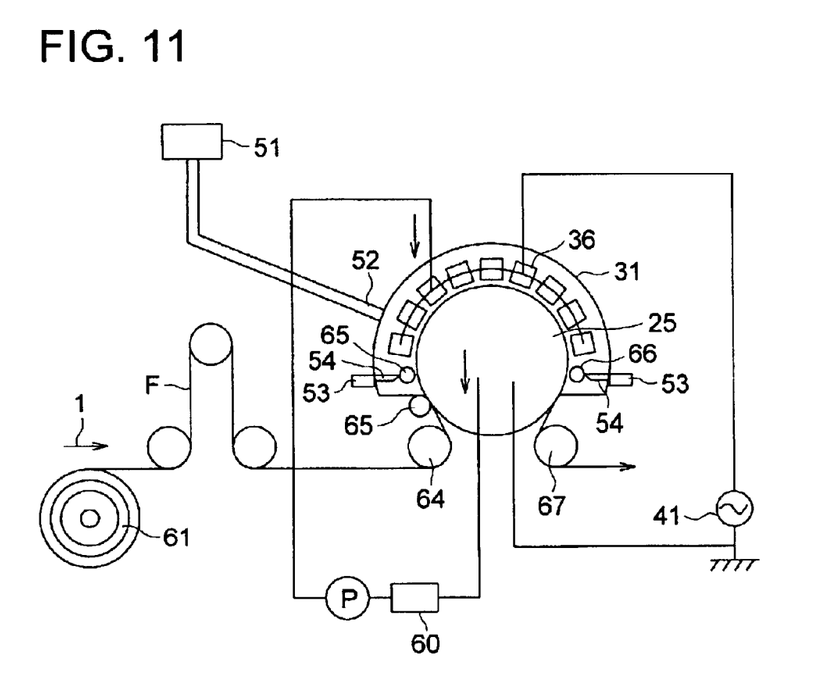
FIG. 11 is a diagram showing an apparatus conducting plasma film forming processing.

FIG. 11 is a diagram showing an apparatus conducting plasma film forming processing. In FIG. 11, there are arranged plasma discharge processing container 31, gas generating device 51, power supply 41, and electrode cooling unit 60, as the constitution of the apparatus. As a cooling agent for the electrode cooling unit 60, insulating materials such as distilled water and oil are used.

In the plasma discharge processing container 31, roll electrode 25 and fixed electrode 36 are arranged at prescribed positions, and a mixed gas generated by the gas generating device 51 is controlled in terms of a flow rate to be put in the plasma discharge processing container 31 from air inlet 52, and a mixed gas to be used for plasma processing is filled in the plasma discharge processing container 31, to be exhausted from air outlet 53. Next, voltage is impressed on the electrode 36 by power supply 41, and the roll electrode 25 is grounded on the ground to generate discharge plasma. In this case, base material F is supplied by roll-shaped mater roll base material 61, and base material F wound around the roll electrode 25 through guide roller 64 is pressed by nip rollers 65 and 66 and is conveyed through the gap between both electrodes in the plasma discharge processing container 31 under the state of one-sided contact (contacting roll electrode 25), thus, the surface of the base material F is discharge-processed by discharge plasma, and after that, it is conveyed to the next process through guide roller 67. In this case, the surface of the base material F that does not contact the electrode 25 only is discharge-processed.

Further, partitioning plate 54 is arranged to be close to the nip rollers 65 and 66, and it controls approach of air that enters the plasma discharge processing container 31.

Roll electrode 25, serving as a ground electrode, is composed of a combination wherein ceramic sealing processed dielectric made by sealing conductive base material such as metal by using inorganic material after injecting melted ceramic. Or, it may also be a combination wherein lining processed dielectric, in which inorganic material is provided on conductive base material by lining, is covered. As a lining material, there are preferably used silicate type glass, borate type glass, phosphate type glass, germanate type glass, tellurite type glass, aluminate type glass and vanadate type glass, and among these, borate type glass is used more preferably because it is easy to be processed. As a conductive base material such as metal, there are given metals such as silver, platinum, stainless steel, aluminum and iron, and stainless steel is preferable from the viewpoint of processing. As a ceramic material used for the melted ceramic injection process, alumina, silicon nitride, etc. are preferably used, and among these, alumina is used more preferably because processing is easy. As base material of roll electrode, it is possible to use a base material of jacket roll that made of stainless steel and has a cooling means by cooled water (not shown in the drawings).

As power supply 41 applying voltage on impression electrode 36, the high frequency power supply made by Pearl Industry (200 kHz), the high frequency power supply made by Pearl Industry (800 kHz), the high frequency power supply made by Nihon Denshi (13.56 MHz) and high frequency power supply made by Pearl Industry (150 MHz), etc. can be employed for this purpose, though there is no limitation for that in particular.

A distance between the impression electrodes mentioned above is determined by considering a thickness of solid-state dielectric provided on the base material of the electrode, an amplitude of the voltage to be applied, an object for employing plasma, etc. As a shortest distance between the solid dielectric on the occasion where the solid dielectric is provided on one of the electrodes and the electrode and a distance between solid dielectrics in the case of arranging the solid dielectrics both of the aforesaid electrodes, it is preferable that both of them are 0.5–20 mm from the viewpoint of conducting even discharging, and especially preferably is 1 mm±0.5 mm.

To the electrodes facing each other, there are given powers of 1 W/cm2 or more at the high frequency wave voltage exceeding 100 kHz, and plasma is generated by exiting reactive gas. By applying the electric field of such high power, it is possible to obtain a densely thin-film which has high uniformity of film thickness and has high functional properties, at high productivity.

An upper limit value of the frequency of the high frequency voltage to be applied onto the space between both electrodes is preferably 150 MHz or less. A lower limit value of the frequency of the high frequency voltage is preferably 200 kHz or more, and more preferable is 800 kHz or more.

A lower limit value of power to be supplied between the electrodes is preferably 1.2 W/cm2 or more, and an upper limit value is preferably 50 W/cm2 or less, and more preferable is 20 W/cm2 kHz or less. Incidentally, an area (/cm2) for impression of voltage on the electrode means an area of a range where electric discharge occurs.

A value of voltage to be applied onto electrode 36 fixed by power supply 41 is determined appropriately. Incidentally, with regard to a method of impression of power supply, it is possible to employ any of the continuous oscillation mode in the continuous sine wave form that is called a continuous mode, and the intermittent oscillation mode conducting ON/OFF intermittently that is called a pulse mode, but a densely film having excellent quality can be obtained by the continuous mode.

To control an influence of plasma processing on the base material to be minimum, it is preferable to control the temperature of the base material to be in the range from ordinary temperature (15° C.–25° C.) –200° C., and the more preferable is to control from ordinary temperature –100° C. For the adjustment to the aforeasaid temperature range, discharge plasma processing is conducted while the electrode and the base material are cooled by the cooling means when necessary.

The discharge plasma processing is conducted under the atmospheric pressure or under the pressure in the vicinity of atmospheric pressure, and the pressure in the vicinity of the atmospheric pressure indicates the pressure of 20 kPa–110 kPa, and the preferable is 93 kPa–104 kPa.

In the electrode for discharging relating to the forming method of thin-film, it is preferable that the maximum hight (Rmax) of the surface roughness stipulated by JIS B 0601 is adjusted to be 10 $\mu$m, and more preferable is that the maximum value of the surface roughness is 8 $\mu$m or less, and an especially preferable value is 7 $\mu$m or less.

Average center surface roughness stipulated by JIS B (Ra) 0.5 $\mu$m or less, and more preferable is 0.1 $\mu$m or less.

Mixed gases will now be described. When said thin film forming method is practiced, gases to be used vary depending on the kind of films provided on the substrate. However, fundamentally, said gas is a mixture consisting of inert gases and reactive gases which are used to form said thin layer. The content ratio of said reactive gases is preferably from 0.01 to 10.00 percent by volume of the mixed gas.

Listed as specific examples of said inert gases are elements of group 18 of the Periodic Table, specifically including helium, neon, argon, krypton, xenon and radon. Of these, helium as well as argon is preferably employed.

For example, it is possible to form an electrically conductive layer, an antistatic layer, or the intermediate refractive index layer of a reflection minimizing layer by employing reactive gases comprising at least one organic metal compound selected from the group consisting of zinc acetyl acetate, triethylindium, trimethylindium, diethylzinc, dimethylzinc, tetraethyltin, tetramethyltin, diacetic acid di-n-butyltin, tetrabutyltin, and tetraoctyltin.

Further, by employing gases comprised of fluorine containing compounds, it is possible to form a water repellent layer in such a manner that fluorine-containing groups are formed on the surface of a substrate so as to decrease surface energy. Listed as fluorine-containing compounds are fluorine-carbon compounds such as hexafluorinated propylene ($CF_3CFCF_2$) and octafluorinated butane ($C_4F_8$). From the viewpoint of safety, are employed hexafluorinated propylene and octafluorinated butane which do not from hazardous hydrogen fluoride gas.

Still further, it is possible to accumulate a hydrophilic polymerization layer by carrying out a treatment under an atmosphere of monomers having a hydrophilic group as well as polymerizable unsaturated bonds in the molecules. Listed as said hydrophilic groups are a hydroxyl group, a sulfonic acid group, a sulfonic acid salt group, a primary, secondary, or tertiary amino group, an amido group, a quaternary ammonium salt group, a carboxylic acid group, and a carboxylic acid salt group. It is also possible to accumulate said hydrophilic polymerization layer in the same manner as above by using monomers having polyethylene glycol chains.

Listed as said monomers are acrylic acid, methacrylic acid, acrylamide, methacrylamide, N,N-dimethylacrylamide, sodium acrylate, sodium methacrylate, potassium acrylate, potassium methacrylate, sodium styrenesulfonate, allylalcohol, allylamine, polyethylene glycol dimethacrylic acid esters, and polyethylene glycol diacrylic acid esters. It is possible to use at least one of these.

Further, it is possible to provide a low refractive index layer or a high refractive index layer by employing reactive gases comprising organic fluorine compounds, silicon compounds, or titanium compounds.

Preferably employed as organic fluorine compounds are fluorinated carbon gases and fluorinated hydrocarbon gases. Listed as fluorinated carbon gases are tetrafluorinated carbon and hexafluorinated carbon, specifically including tetrafluorinated methane, tetrafluorinated ethylene, hexafluorinated propylene, and octafluorinated cyclobutane.

Further, employed may be halides of fluorinated hydrocarbons such as monochlorinated trifluorinated methane, monochlorinated difluorinated methane, and dichlorinated teterafluorinated butane, and fluorine substitution compounds of alcohols, acids and ketones. However, the present invention is not limited to these. Further, these compounds may have ethylenic unsaturated bonds in the molecules. Said compounds may be employed individually or in combination.

When the aforesaid organic fluorine compounds are employed in mixed gases, from the viewpoint of uniformly forming a thin layer on a substrate, employing a discharge plasma process, the content ratio of said organic fluorine compounds in said mixed gases is preferably from 0.1 to 10.0 percent by volume, and is more preferably from 0.1 to 5.0 percent by volume.

Further, when said organic fluorine compounds are in the form of gas at normal temperature and normal pressure, they may be employed as a component of said mixed gas without any modification. As a result, they may be readily employed. On the other hand, when said organic fluorine compounds are in the form of liquid or solid at normal temperature and normal pressure, they may be employed upon being gasified employing methods such as heating and pressure reduction. Further, they may be employed upon being dissolved in suitable solvents.

When the aforesaid titanium compounds are employed in mixed gases, from the viewpoint of uniformly forming a thin layer on a substrate, employing a discharge plasma process, the content ratio of said titanium compounds in said mixed gases is preferably from 0.1 to 10.0 percent by volume, and is more preferably from 0.1 to 5.0 percent by volume.

Further, by incorporating hydrogen gas in the aforesaid mixed gases in an amount of 0.1 to 10.0 percent by volume, it is possible to markedly enhance the hardness of said thin layer.

Still further, by incorporating components selected from the group consisting of oxygen, ozone, hydrogen peroxide, carbon dioxide, carbon monoxide, hydrogen, and nitrogen in the aforesaid mixed gases in an amount of 0.01 to 5.00 percent by volume, it is possible to enhance the reaction rate and to form the desired thin layer.

From the viewpoint of handling, preferred as the aforesaid silicon compounds as well as titanium compounds are metal hydrogen compounds and metal alkoxides. Of these, metal alkoxides are more preferably employed, since they are not corrosive, do not generate hazardous gases and result in minimal staining during processing.

Further, introduction of the aforesaid silicon compounds as well as titanium compounds into the space between electrodes, which is employed as a discharge space, may be carried out irrespective of their states such as gas, liquid, or solid. When they are in the form of gas, it is possible to introduce into said discharge space without any modification. However, when they are in the form of liquid or solid, they are used upon being gasified employing methods such as heating, pressure reduction, and ultrasonic wave application. When silicon compounds as well as titanium compounds, such as tetraethoxysilane and tetraisopropoxytitanium, are employed upon being gasified, metal alkoxides are suitably employed which are in the form of liquid at normal temperature, having a boiling pint of less than or equal to 200° C. Said metal alkoxides may be employed upon being diluted by solvents. Employed as said solvents may be organic solvents such as methanol, ethanol, and n-hexane, and mixtures thereof. Incidentally, since said dilution solvents are decomposed into their molecular state and atomic state during said plasma discharge process, it is possible to neglect any of their effects against thin layer formation on the substrate, and compositions of said thin layer.

Preferably employed as said silicon compounds are, for example, organic metal compounds such as dimethylsilane and tetramethylsilane, metal hydrogen compounds such as monosilane and disilane, metal halogen compounds such as dichlorinated silane and trichlorinated silane, alkoxysilanes such as tetramethoxysilane, tetraethoxysilane, and dimethylethoxysilane, and organosilanes. However, the present invention is not limited to these. Further, these may be suitably employed in combination.

When the aforesaid silicon compounds are employed in mixed gases, from the viewpoint of uniformly forming a thin film on the substrate, employing a discharge plasma process, the content ratio of said silicon compounds in said mixed gases is preferably from 0.1 to 10.0 percent by volume, and is more preferably from 0.1 to 5.0 percent by volume.

Preferably employed as said titanium compounds are organic metal compounds such as tetradimethylaminotitanium, metal hydrogen compounds such as monotitanium and dititanium, metal halogen compounds such as titanium dichloride, titanium trichloride, and titanium tetrachloride, and metal alkoxides such as tetraethoxytitanium, tertaisopropoxytitanium, tetrabutoxytitanium. However, the present invention is not limited to these.

<Supports>

Supports are comprised of glass or flexible resinous sheets. For example, plastic films may be employed as a sheet. Listed as said plastic films are those which are comprised of, for example, polyethylene terephthalate (PET), polyethylene naphthalate (PEN), polyethersulfone (PES), polyetherimide, polyetherketone, polyphenylenesulfide, polyallylate, polyimide, polycarbonate (PC), cellulose triacetate (TAC), and cellulose acetate propionate (CAP). These films may be subjected to a surface treatment and surface coating which are known in the art. For example, a vacuum evaporation film formed by employing silicon oxide together with aluminum oxide, a film comprised of metal oxides such as silicon oxide and aluminum oxide, which is prepared employing an atmospheric pressure plasma method, or a multilayered composite film may be formed as a gas barrier layer. Further, a composite film may be employed which is prepared by laminating films vacuum-deposited with a thin layer comprised of metals such as aluminum, or minute metal oxide particles may be incorporated in said film. As mentioned above, by employing said plastic film, it is possible to decrease weight, to enhance portability, and to enhance durability against impact, compared to the case in which glass substrates are employed.

<Protective Film>

In order to minimize a decease in working life due to oxygen and moisture in atmosphere, it is preferable that said organic semiconductor layer is separated from atmosphere by the use of a protective film. Employed as said protective film are gas barrier films comprised of PVA and ethylene-vinyl alcohol copolymers, and metal oxides and metal nitrides, known in the art.

Suitably employed as said metal oxides and metal nitrides may be silicon oxide, aluminum oxide, tantalum oxide, titanium oxide, silicon nitride, and aluminum nitride.

Listed as methods for forming said protective film are those using dry processes such as a vacuum deposition method, a molecular beam epitaxial growth method, an ion cluster beam method, a low energy ion beam method, an ion plating method, a CVD method, a sputtering method, and an atmospheric pressure plasma method, and wet processes using coating methods such as a spray coating method, a spin coating method, a blade coating method, a dip coating method, a casting method, a roll coating method, an bar coating method, as well as methods employing patterning such as printing and ink jet printing. It is possible to employ any of these methods based on materials. Of these, the aforesaid atmospheric pressure plasma method is preferred.

It is possible to employ an inorganic oxide film and an organic oxide film while laminating these. The thickness of these insulation films is commonly from 50 nm to 3 μm, and is preferably from 100 nm to 1 μm.

[Display Panel]

Applied examples in which a display element is formed by utilizing the characteristics of the organized semiconductor materials will be explained as follows.

Figure 2:
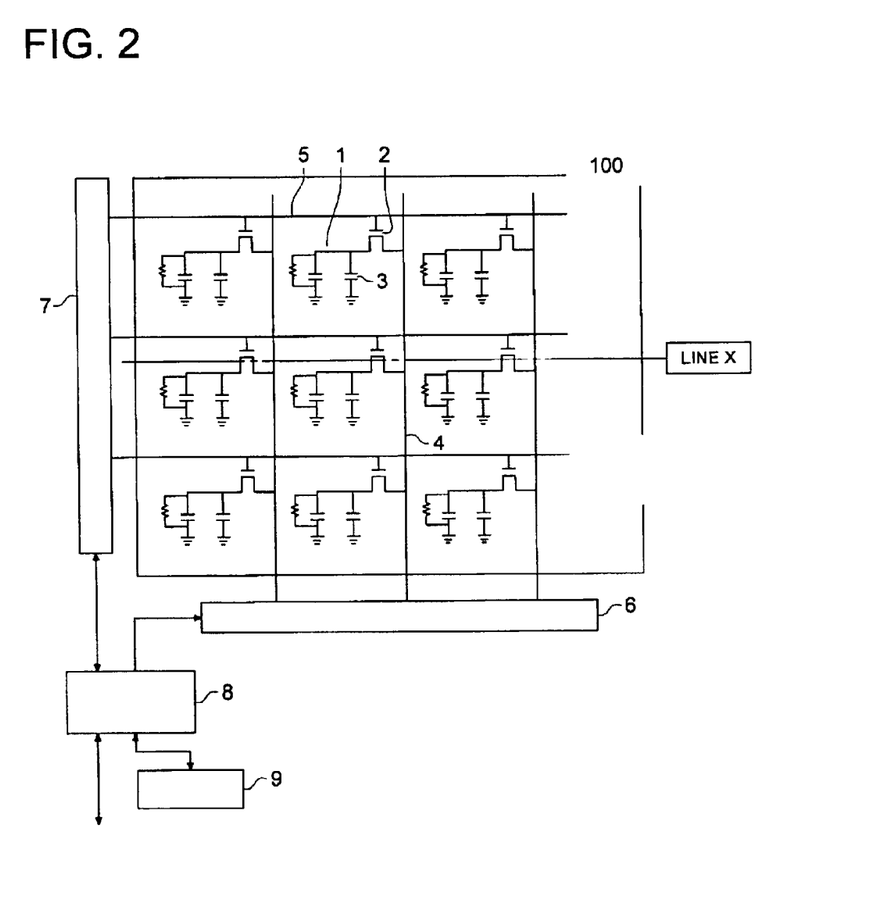
FIG. 2 is a block diagram showing the overall structure of a display panel of the invention.

FIG. 2 is a block diagram showing the overall structure of the display panel.

Each pixel arranged in a matrix form on display panel 100 of display device has a flat plate electrode 1 (display image section in the drawing) that accumulates electric charges and gives an electric field to a liquid crystal. A transistor section (TFT drive section 2) that switches ON and OFF of the electric current to the flat plate electrode and capacitor 3 are arranged for each flat plate electrode. The capacitor 3 accumulates electric charges and keeps them at the prescribed timing to maintain the electric field for the corresponding flat plate electrode 1. Driving control of liquid crystal by these flat plate electrodes is executed by the aforesaid TFT driving section 2, and this is controlled by power supply line (source line 4) corresponding to the pixel controlled by vertical drive circuit 6 and by control signal line (gate line 5) corresponding to the pixel controlled by horizontal drive circuit 7.

On the panel 100, plural source lines 4 which are in parallel each other and plural gate lines 5 which are in parallel each other are arranged to intersect.

The aforesaid horizontal driving circuit 7 and the aforesaid vertical driving circuit 6 are controlled by control circuit 8 in accordance with the required image signals. Memory 9 is a buffer memory for holding image data for one image plane, for example, and the control circuit 8 reads required image signals from the memory 9.

Figure 3:
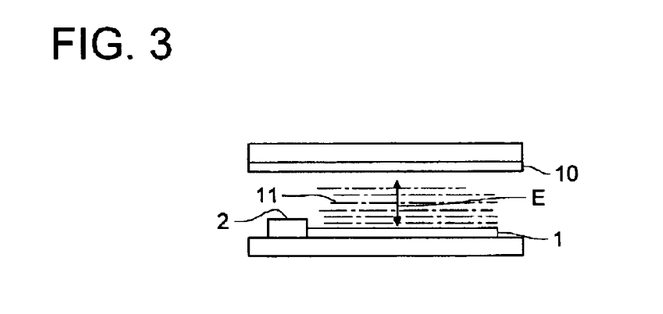
FIG. 3 is a schematic diagram showing a sectional view of each pixel in FIG. 2.

As shown in FIG. 3, display material 11 such as liquid crystal is sealed to be sandwiched by the flat plate electrode 1 and surface electrode 10 arranged above the flat plate electrode 1. For the display material 11, organic EL and an element using electrophoresis in addition to liquid crystal can be used. Then, electric field is applied on display material 11 of display pixel section, responding to the control of the TFT driving section 2, and display is controlled at a unit of pixel.

Incidentally, in this case, for the purpose of satisfying functions as display, the aforementioned surface electrode 10 has light transmission property, and a transparent conductive film is used as a practical example. The transparent conductive film is formed by using conductive transparent material such as, for example, indiumtinoxide (ITO), SnO2, or ZnO. For forming the transparent electrode film, a thin film can be formed by employing a method of evaporation deposition or a method of sputtering. It is preferable for the transparent conductive film that its transmission factor is greater than 10%, and sheet resistance is several hundreds Ω/or less. Coating thickness is formed to be a thickness of 10 nm or more, though it depends a material. The reason for the foregoing is that when the coating thickness is thin, transparent electrodes become a shape of islands.

The transparent conductive film can be applied of forming of the flat plate electrode 1, and in this case, a desired form pattern may be formed through a photolithography method, or a pattern may be formed through a desired form mask in the case of evaporation deposition or sputtering of the aforesaid electrode substances.

It is also possible to provide the prescribed transparent protective layer on the upper position of the surface electrode 10, and for example, it is possible to form the functional film such as a reflection prevention layer.

Figure 4:
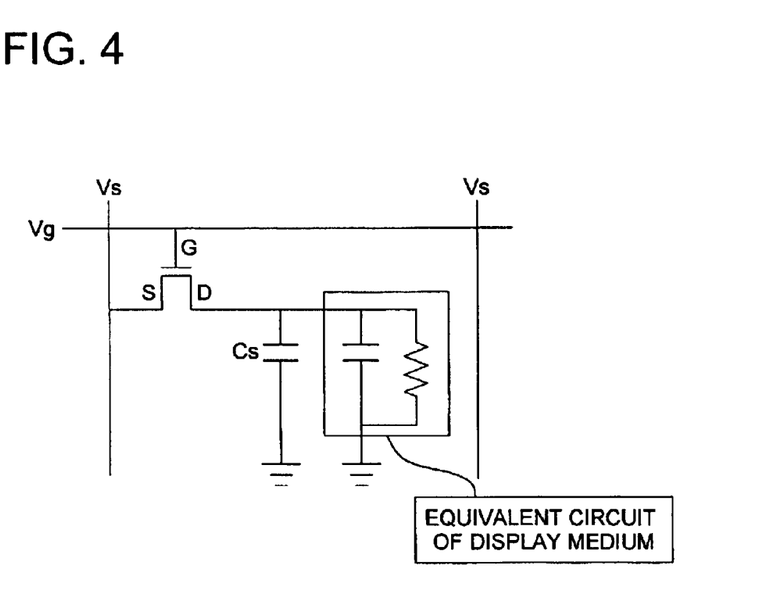
FIG. 4 is a diagram showing an equivalent circuit of each pixel.

An equivalent circuit of each pixel in FIG. 2 is the same as that in FIG. 4. "S" represents a source electrode, "D" represents a drain electrode, "G" means a gate electrode, and S, D and G constitute TFT driving section 2. Cs represents a capacitor for holding an electric field to be applied onto liquid crystal or other display medium. Incidentally, source voltage Vs is applied onto the source electrode S, and gate voltage Vg is applied onto the gate electrode G.

[Layout of Each Member]

Figure 5:
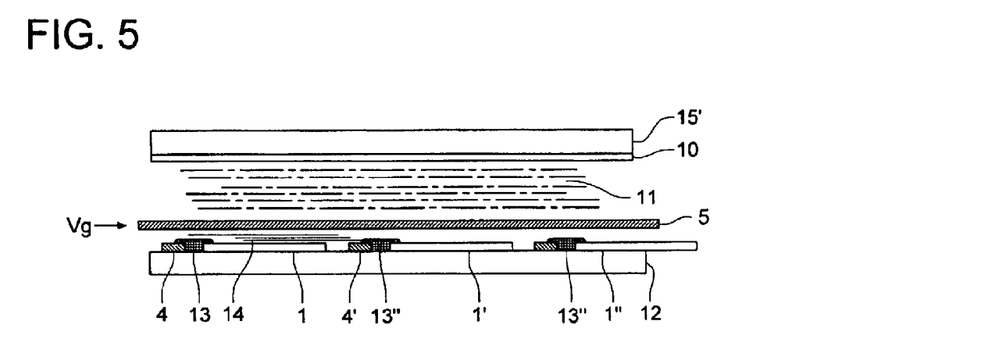
FIG. 5 is a diagram for showing practical arrangement of each member in the invention, and it is a diagram corresponding to a sectional view on line X in FIG. 2.

Next, concrete layout of each member in the invention will be explained. When each pixel is viewed, its constituting members are arranged as shown in FIG. 5. FIG. 5 mostly corresponds to a sectional view on line X in FIG. 2.

Each of said plate electrodes (1, 1', and 1") is arranged on first support 12 at even intervals. Said first support 12 is comprised of a flexible resinous sheet. For example, it is possible to use a plastic film as said sheet. Listed as said plastic films are films comprised of, for examples, polyethylene terephthalate (PET), polyethylene naphthalate (PEN), polyethersulfone (PES), polyetherimide, polyether ether ketone, polyphenylenesulfide, polyallylate, polyimide, polycarbonate (PC), cellulose triacetate (TAC), and cellulose acetate propionate (CAP). As mentioned above, by employing said plastic film, it is possible to decrease weight, to enhance portability, and to enhance durability against impact, compared to the case in which glass substrates are employed.

Further, plasticizers such as trioctyl phosphate and dibutyl phthalate may be incorporated in these plastic films and benzotriazole based or benzophenone based UV absorbers, known in the art, may also be incorporated in the same. Further, it is possible to employ as raw material resins which have been prepared employing a so-called organic-inorganic polymer hybrid method in which molecular weight is increased by providing chemical catalysts or energy such as heat and radiation while inorganic polymers such as teraethoxysilane are added as a raw material.

EXAMPLES

Several embodiments based on the foregoing will now be described. The formation of the insulation film, employing the atmospheric pressure plasma method, is detailed below.

Each flat plate electrode (1, 1', 1") and each source line (4, 4', 4") are arranged side by side while keeping the prescribed interval. Then, organic semiconductor section (13, 13', 13") are arrange to bridge flat plate electrode ends and corresponding source lines (4, 4', 4") (the same as FIGS. 1(a) and 1(b)).

Above the organic semiconductor section (13, 13', 13"), there is further arranged an insulating layer 14 (insulating film). For the insulating layer 14, insulating film of $SiO_2$ or $TiO_2$ can be used.

For example, when forming an insulating layer with $SiO_2$ or $TiO_2$, it is possible to form a film by plasma processing under the aspheric pressure. In this method, it is possible to form insulating film, which is extremely uniform, and it is also effective for controlling the organic semiconductor section (13, 13', 13").

The insulating layers 14 are formed at the positions to insulate source for a current path from the source lines (4, 4', 4") to the flat plate electrodes (1, 1', 1") on the pattern of the organic semiconductor section (13, 13', 13") and for the gate line 5 to be arranged in the next step.

When forming insulating layers 14 in the aforesaid method, on the entire surface of the first support 12, it is not necessary to control the positions of formation of insulating layers depending on the organic semiconductor section (13, 13', 13") or the intersecting sections between gate line 5 and source lines (4, 4', 4"). Further, because of the improvement of the line speed in manufacturing process, an insulating layer can be formed in a short time even a panel is large in area.

On the other hand, it is also possible to form insulating layer 14 for each pixel for the organic semiconductor section (13, 13', 13") or the intersecting sections between gate line 5 and source lines (4, 4', 4"). An ink jet method can be used as a forming method. In the patterning in the invention, insulating film 14 can be coated broadly to cover both the organic semiconductor section (13, 13', 13") and the intersecting sections between gate line 5 and source lines (4, 4', 4"). In this case, it is possible to reduce raw material cost by securing switching operations even for patterning with low accuracy though processing speed is restricted, rather than making insulating film on the entire surface of the support.

When providing insulating layer 14 on the entire surface of the first support 12, or when providing partially, in any case, if the same insulating layer 14 covers the organic semiconductor section (13, 13', 13") and the intersecting sections between gate line 5 and source lines (4, 4', 4"), it is possible to simplify the forming process of insulating layers.

Figure 7:
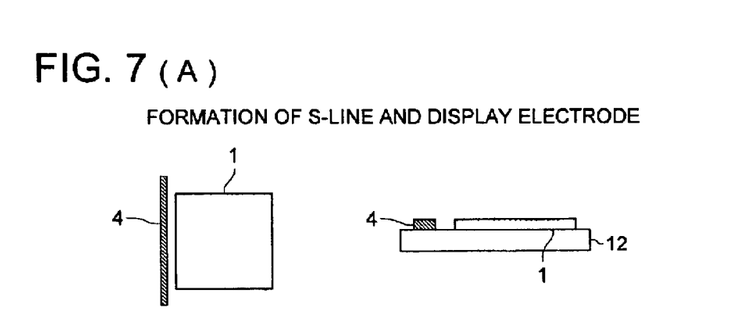
FIG. 7(A), FIG. 7(B), FIG. 7(C) and FIG. 7(D) are diagrams showing patterning processes of each element material in the first embodiment of the invention.

Above the insulating layer 14, the gate line 5 intersects with the source lines (4, 4', 4") at right angles, and is arranged to be positioned above the organic semiconductor section (13, 13', 13") (described later, referring to FIG. 7). The second support is arranged above the gate line 5 of the corresponding pixel through display material 11 (liquid crystal, etc.). This second support has conductivity and it becomes a facing electrode for the flat plate electrodes (1, 1', 1") of each pixel. In this case, the conductive film 10 (transparent conductive film is preferable) is formed on the surface of one side of the second support. This conductive film 10 can be provided at least the position corresponding to the flat plate electrodes (1, 1', 1") of each pixel, and it is possible to make facing electrode easily by covering the entire surface of the second support with conductive film and by grounding them.

[Capacitor Structure]

Figure 6:
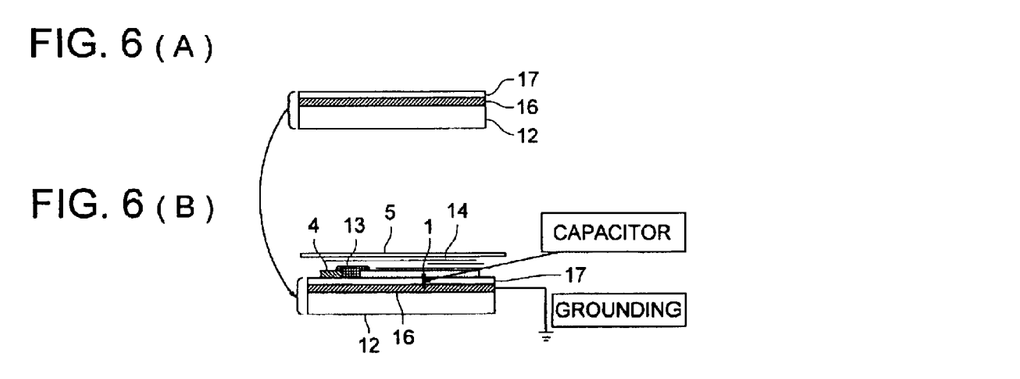
FIG. 6 is a diagram showing a capacitor structure in each pixel of the invention.

When the distance between the flat electrode 1 on the first support 12 mentioned above and the conductive thin-layer 16 facing the flat electrode 1 is sufficiently small, by controlling the dielectric constant of the display material to be sealded, a capacitor structure can be formed between the flat electrode 1 and the facing electrode and makes it possible to maintain the electronic field.

On the other hand, when the distance between the flat electrode 1 on the first support 12 mentioned above and the conductive thin-layer 16 facing the flat electrode 1 is sufficiently large, it is desirable that the following processing are applied before the flat electrode 1 is provided on the first support 12 for every pixels as shown in FIG. 6(A).

(1) The conductive thin-layer 16 is formed on the entire surface of the first support 12. This formation is possible by uniformly vapor-depositing the metal material on it by means of the spattering method, etc.
(2) Then, the insulating layer 17 is covered on the entire surface of the conductive thin-layer 16 formed by the above process. For this purpose, either an applying process at the normal pressure or the aforementioned plasma processing can be applied, and it is also possible to form the insulating layer 17 while controlling the layer thickness in a unit of micron order (or sub-micron order).

According to the abovementioned processing, it becomes possible to constitute a capacitor structure between the conductive thin-layer 16, formed in advance when the flat electrode 1 is formed on the first support 12 after the above process, and the flat electrode 1, and to strongly maintain the electronic field (namely, it is possible to intensify the strength of the electronic field applied to the display material 11). Incidentally, in this example, the conductive thin-layer 16 mentioned above is grounded (refer to FIG. 6(B)).

Incidentally, although the conductive thin-layer 16 is formed on the entire surface of the first support 12 in the above example, by arranging a plurality of conductive earth-lines so as to face the flat electrode 1, it is also possible to form a capacitor structure between the plurality of conductive earth-lines and the flat electrode 1. In this case, the plurality of conductive earth-lines are grounded as well as the conductive thin-layer 16 mentioned above.

Even if the spattering method is employed in a part of the forming process of the conductive thin-layer 16, a patterning process, such as a photolithography, a developing process, etc., is not necessary. Therefore, it becomes possible to form the abovementioned capacitor structure with relatively low manufacturing cost.

[Process of Patterning]

FIGS. 7(A)–7(D) show a schematic diagram of a formation process of materials onto the first support 12. In the following, the formation process with respect to one pixel will be detailed.

Initially, a plurality of source lines and a plurality of flat electrodes are formed on the first support 12 in advance (refer to FIG. 7(A)). Although anyone of the well-known methods for forming the metallic thin layer (such as the spattering method, the method of transferring the conductive material, etc.) can be employed for this purpose, the spattering method is employed for forming source lines 4 and flat electrodes 1 in the this example.

Then, a solution or a dispersed-liquid of the organic semiconductor material is employed for the patterning process, so that the organic material dispersed-liquid overlaps both each of source lines 4 and each of flat electrodes 1 (refer to FIG. 7(B)). Since the organic material dispersed-liquid, employed for the patterning process, exhibits a high fluidity, the dot formation by means of the ink-jetting method is employed for the patterning process. Pattern 13 of the organic semiconductor material could be an arbitral shape, though pattern 13 is conceptually illustrated. Of cause, this patterning process also can be achieved by application and drying process after the masking process, for which conventional well-known methods, such as the electro-photographic method, etc., can be employed.

According to the abovementioned patterning method, it becomes possible to form the semiconductor layer in an environment of normal pressure without repeating vapor-depositing processes and etching processes as performed in the conventional Si-semiconductor process.

The organic semiconductor section 13, formed by the abovementioned process, is arranged so as to connect a part of flat electrodes 1 with source line 4. In this example, the organic semiconductor is formed as a dot so as to cover both an end portion of flat electrode 1 and a part of source line 4. In other words, a part of flat electrode 1 is continuously coupled to source line 4 only by a single semiconductor material. Alternatively, instead of directly connecting, it is also possible that an arbitral electrode is inserted between the organic semiconductor section 13 and the flat electrode 1 or between the organic semiconductor section 13 and the source line 4, in order to support the electronic connection.

Next, the insulating layer 14 of $SiO_2$ is formed on the pattern of the abovementioned organic semiconductor section 13, formed in the process shown in FIG. 7(B), (refer to FIG. 7(C). The insulating layer 14 covers the entire surface of the panel 100, and also covers both the electronic current path from the source line 4 to the flat electrode 1 on the organic semiconductor pattern and a position at which the source line 4 is insulated from the gate line 5 to be arranged in the next process (a position at which the source line 4 and the gate line 5 crosses each other).

The insulating layer 14 mentioned above is formed by the plasma film formation processing under the atmospheric pressure, and by employing the mixed gas for forming the $SiO_2$ layer. Since the insulating layer 14 is formed over the entire surface of the first support 12 as aforementioned, it is not necessary to control the forming position of the insulating layer 14 in response to the intersecting position of gate line 5 and source line 4. Since the processing can be performed under the atmospheric pressure, it becomes possible to introduce the conveyer method into the manufacturing line, and therefore, it becomes possible to shorten the formation time for the insulating layer 14 by improving the conveyer speed of the manufacturing line, even if the large-sized panel is manufactured in the line.

As shown in FIG. 7(D), next, the gate line 5 is formed on the insulating layer 14 in such a manner that the gate line 5 crosses the source line 4 (in this example, the gate line 5 is orthogonal to the source line 4) and covers the organic semiconductor section 13. This pattern can be formed by the method of applying or transferring the conductive material, or by the method of continuously forming ink-jetting dots. As shown in the drawing, in this example, the gate line 5 is a signal line, which also works as a gate electrode crossing the organic semiconductor section 13 and directly affecting to the organic semiconductor section 13 as it is without diverging.

Although the insulating layer 14 is made of $SiO_2$ in the abovementioned patterning process, $TiO_2$ also can be employed for forming the insulating layer 14 (in the process shown in FIG. 7(C)). In the embodiment employing $TiO_2$, the insulating layer 14 is formed by the plasma film formation processing under the atmospheric pressure, and by employing the mixed gas for forming the $TiO_2$ layer. The structure other than the abovementioned insulating layer 14 is the same as that in the foregoing. Accordingly, the insulating layer 14 made of $TiO_2$ covers the entire surface of the panel 100, and also covers both the electronic current path from the source line 4 to the flat electrode 1 on the organic semiconductor pattern and a position at which the source line 4 is insulated from the gate line 5 to be arranged in the next process (a position at which the source line 4 and the gate line 5 crosses each other).

Incidentally, when display material 11 (liquid crystal, etc.) is sealed, the following process will be applied.

The opposing electrode is formed on the second support, and conductivity is added to the surface of the opposing electrode. For this purpose, it is applicable that the conductive thin-layer 16 is formed at at-least a position facing to the plurality of flat electrodes on the first support 12. In this example, a transparent conductive thin-layer 16 is formed over the entire surface of the second support. Although it is possible that the second support, on which conductive thin-layer 16 is formed, is arranged at a third support side in respect to the first support 12 (refer to FIG. 8(A)), it is also possible that the second support is arranged opposite the third support in respect to the first support 12 (refer to FIG. 8(B)).

Figure 8:
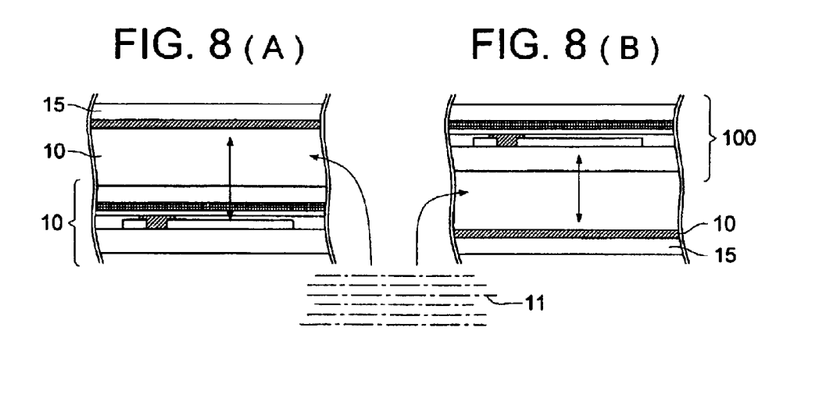
FIG. 8(A) and FIG. 8(B) are diagrams showing occasions where display materials are sealed in the third embodiment of the invention.

In the former case, the display material 11 is injected into the space, maintaining a predetermined gap, between the third support and the second support, and is sealed in it. While, in the latter case, the display material 11 is injected into the space, maintaining a predetermined gap, between the first support 12 and the second support, and is sealed in it.

EXAMPLES

Several embodiments based on the foregoing will now be described. The formation of the insulation film, employing the atmospheric pressure plasma method, is detailed below.

Process Example

<<Reactive Gas>>

The composition of the mixed gas (being the reactive gas), which is employed for the plasma process, will now be described below.

(For Forming an $SiO_2$ Layer)

Inert gas: argon 98.25 percent by volume

Reactive gas 1: hydrogen gas 1.5 percent by volume

Reactive gas 2: tetramethoxysilane vapor (bubbled employing argon gas) 0.25 percent by volume (For Forming a $TiO_2$ Layer)

Inert gas: argon 98.9 percent by volume

Reactive gas 1: hydrogen gas 0.8 percent by volume

Reactive gas 2: tetraisopropoxytitanium vapor (liquid heated at 150° C. was bubbled with argon gas) 0.3 percent by volume The atmospheric pressure plasma process is continuously carried out onto the hard coat layer of substrate film 8 under said discharge conditions employing said reactive gases, whereby a 100 nm thin film is provided.

<<Discharge Condition>>

Discharge output should be set at 10 $W/cm^2$.

<<Electrode Conditions>>

A roll electrode comprising a dielectric (having a relative dielectric constant of 10), which is grounded, is prepared as follows. A mother stainless steel jacket roll, having a cooling means employing cooling water, is covered with 1 mm thick alumina, employing ceramic spraying. Thereafter, a solution prepared by diluting tetramethoxysilane with ethyl acetate is applied and subsequently dried. Subsequently, the resultant coating is hardened while exposed to ultraviolet rays so that pores are sealed. The resultant surface is then smoothed so as to be Rmax5 $\mu$m. On the other hand, an applied electrode is prepared by covering a hollow square-shaped stainless steel pipe with the same dielectric as above under the same conditions.

A prepared organic thin film transistor element will now be described below.

Example A

The organic thin film transistor element, shown in FIG. 1(*a*), was prepared as described below.

A thin 500 Å thick Au film was vacuum-deposited on a 150 $\mu$m thick polyimide film, and each of a source electrode and a drain electrode was formed employing a photolithographic method. The channel length was determined to be 20 $\mu$m. Further, a chloroform solution of regioregular-poly (3-hexylthiophene), purified as desired, was ejected employing piezoelectric system ink jet and the portion between said source electrode and said drain electrode was filled with said solution. By removing chloroform as a solvent through drying, the resultant was heated at 100° C. for 5 minutes and was set aside at vacuum for 24 hours. The resultant thickness of said regioregular-poly (3-hexylthiophene) film was approximately 50 nm. After being exposed to an atmosphere of ammonia gas at room temperature for 5 hours, a 200 nm thick silicon oxide film was formed on said source electrode, said drain electrode, and said regioregular-poly (3-hexylthiphene), employing the aforesaid atmospheric pressure plasma method. A desired film, which exhibited excellent adhesion onto said regioregular-poly (3-hexylthiphene) film, was obtained. Next, a 30 $\mu$m wide gate electrode was formed by employing an Ag paste available in the conventional market, and as a result, the organic thin-film transistor element, shown in the structural example A, is obtained.

Comparative Example 1

An element was prepared in the same manner as Example A, except that the silicon oxide film was formed employing a conventional sputtering method.

Comparative Results

Figure 10:
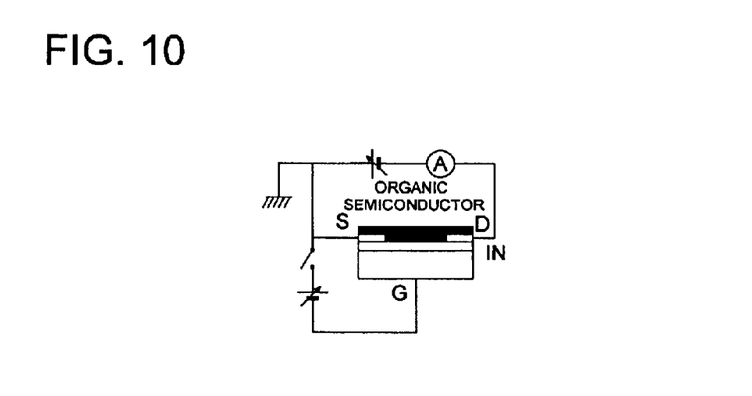
FIG. 10 is a diagram showing a system for evaluating transistor characteristics.

By employing the system for evaluating transistor characteristics shown in FIG. 10, characteristics of both transistors were measured. As a result, both exhibits good operational characteristics as a p-channel FET transistor and the following results were obtained. The leak electric current refers to the leak current value at the gate insulation layer when the voltage between the source and the gate is −30 V, and the breakdown voltage refers to a voltage value at which dielectric breakdown of the gate insulation layer occurs, while the on/off ratio refers to the electric current ratio when the gate voltage is set at −30 V and +30 V, while setting the voltage between the source and the drain at −30 V.

|  | Leak Electric Current | Breakdown Voltage | On/Off Ratio |
| --- | --- | --- | --- |
| Example 1 | −0.2 nA | −150 V | 10000 |
| Comp. Example 1 | −10 nA | −80 V | 5000 |
| Example 2 | −0.1 nA | −170 V | 15000 |

Incidentally, the organic thin-film transistor element of Example 2 is made and evaluated in the entirely same process as that of Example 1, except that the silicon oxide film of the gate insulation layer is change to the titanium oxide, thickness of which is 200 nm.

Example B

The thin organic film transistor element, shown in FIG. 1(*b*), was prepared as described below.

A vacuum-deposited Al film was formed on a 150 $\mu$m thick PET film, and subsequently, a 30$\mu$ wide gate electrode was formed employing a photolithographic method. A 200 nm thick silicon oxide film was formed on the resultant gate electrode in the same manner as Example 1. Further, a thin 300 Å thick Cr film and a thin 500 Å thick Au film were vacuum-deposited one by one, and each of a source electrode and a drain electrode was formed employing a photolithographic method. The channel length was determined to be 20 μm. Further, a chloroform solution of regioregular-poly (3-hexylthiophene), purified as desired, was ejected employing piezoelectric system ink jet and the portion between said source electrode and said drain electrode was filled with said solution. By removing chloroform as a solvent through drying, the resultant was heated at 100° C. for 5 minutes and was set aside at vacuum for 24 hours. The resultant thickness of said regioregular-poly (3-hexylthiophene) film was approximately 100 nm. After being exposed to an ammonia gas atmosphere at room temperature for 5 hours, the transistor element was sealed by forming a silicon oxide film having 500 nm thickness through the deposition process. Then, the transistor characteristics were measured in the same process as that of Example 1.

Comparative Example 2

An element was prepared in the same manner as Example 3, except that a silicon oxide film was formed employing a conventional sputtering method.
Comparative Results As well as Example A, by employing the system for evaluating transistor characteristics shown in FIG. 10, characteristics of both transistors were measured. The leak electric current refers to the leak current value at the gate insulation layer when the voltage between the source and the gate is −30 V, and the breakdown voltage refers to a voltage value at which dielectric breakdown of the gate insulation layer occurs, while the on/off ratio refers to the electric current ratio when the gate voltage is set at −30 V and +30 V, while setting the voltage between the source and the drain at −30 V.

|  | Leak Electric Current | Breakdown Voltage | On/Off Ratio |
| --- | --- | --- | --- |
| Example 3 | −0.3 nA | −140 V | 20000 |
| Comp. Example 1 | −50 nA | −70 V | 3000 |
| Example 4 | −0.1 nA | −150 V | 30000 |

Incidentally, the organic thin-film transistor element of Example 4 is made and evaluated in the entirely same process as that of Example 1, except that the silicon oxide film of the gate insulation layer is change to the titanium oxide, thickness of which is 200 nm.

As described in the foregoing, the insulation film, formed in the atmospheric pressure plasma method, is close and has little defects and exhibits a good electronic-field effect. Accordingly, it becomes possible to reduce the leak current of the gate insulation layer and the gate voltage, and to improve the on/off ratio, resulting in realization of the good performances of the thin-film transistor and improvement of the insulation durability.

Further, according to the present invention, it is revealed that the new combination of the insulation film, formed in the atmospheric pressure plasma method, and the organic semiconductor material exhibits superior effects, compared to the combination of the conventional insulation film and the organic semiconductor material. Since the film formation under the atmospheric pressure environment is possible, the present invention is suitable for processing the flexible base, such as polymer support member, etc., and it is possible to drastically reduce the manufacturing cost of the organic FET.

As described in the foregoing, according to the present invention, it is possible to improve the characteristics of the device, such as the on/off ratio, the leak current, etc., when the organic semiconductor is employed as the active semiconductor layer in the thin-film TFT of the device. Further, since the formation process of the insulation film does not require a vacuum processing, it becomes possible to reduce the manufacturing cost and to simplify the manufacturing process, resulting in the drastic reduction of the total manufacturing cost.

Disclosed embodiment can be varied by a skilled person without departing from the spirit and scope of the invention.

What is claimed is:

1. A method of manufacturing an organic semiconductor device which includes a drain electrode, a source electrode, a gate electrode, an organic semiconductor film provided between the drain electrode and the source electrode, and an insulation film provided between the gate electrode and both of the drain electrode and the source electrode as components of the organic semiconductor device, the method comprising:

a step of forming the insulation film under an atmospheric pressure environment of 20 kPa to 110 kPa by employing a plasma processing on at least one of the components.

2. The method of claim 1, wherein a reactive gas is excited into plasma by a discharging operation under, the atmospheric pressure condition.

3. The method of claim 1, wherein said organic semiconductor device is fabricated on a supporting substrate; and wherein, after said source electrode and said drain electrode are formed on said supporting substrate, a field-effect active layer, made of said organic semiconductor film, is fabricated between them, and then, said insulation film and said gate electrode are successively formed on said field-effect active layer.

4. The method of claim 3, wherein said organic semiconductor device is fabricated on a supporting substrate; and wherein, after said gate electrode is formed on said supporting substrate, said insulation film is formed so as to cover said gate electrode, and then, said source electrode, said drain electrode and a field-effect active layer, made of said organic semiconductor film, are successively formed on said insulation film.

5. The method of claim 1, wherein said insulation film comprises either oxide compounds or nitride compounds.

6. The method of claim 5, wherein said insulation film comprises anyone of silicon oxide, aluminum oxide, tantalum oxide and titanium oxide.

7. The method of claim 5, wherein said insulation film comprises silicon nitride.

8. The method of claim 1, wherein said organic semiconductor film is made of π-conjugated polymers.

9. The method of claim 1, wherein said organic semiconductor device is fabricated on a supporting substrate; and wherein said supporting substrate is a sheet made of a resin material.

10. The method of claim 9, wherein said sheet is a plastic film.

11. The method of claim 1,
wherein said organic semiconductor device is fabricated on a supporting substrate; and
wherein said supporting substrate is made of polymers.

12. The method of claim 1,
wherein said organic semiconductor device is fabricated on a supporting substrate; and further comprising the steps of:
forming said source electrode and said drain electrode on said supporting substrate; and
forming said gate electrode on said insulation film.

13. The method of claim 1,
wherein said organic semiconductor device is a transistor.

14. The method of claim 1,
wherein said organic semiconductor device is fabricated on a supporting substrate being a sheet made of a resin material, and
wherein the method further comprises steps in the following order;
(1) a step of forming the gate electrode on the supporting substrate;
(2) the step of forming the insulation film on the gate electrode under an atmospheric pressure environment of 20 kPa to 110 kPa by employing the plasma processing;
(3) a step of forming the organic semiconductor film, the drain electrode and the source electrode on the insulation film.

15. The method of claim of claim 14, wherein in the step (3), the drain electrode and the source electrode are formed on the insulation film, thereafter the organic semiconductor film is formed between the drain electrode and the source electrode.

16. The method of claim of claim 14, wherein in the step (3), the organic semiconductor film is formed on the insulation film, thereafter the drain electrode and the source electrode are formed on the organic semiconductor film.

17. The method of claim of claim 1, wherein the plasma processing comprising steps of:
introducing a processing gas between at least two discharging electrodes which are placed to face each other with a space under the atmospheric pressure environment;
conveying a component of the organic semiconductor device into the space between the two discharging electrodes; and
applying electric voltage between the two discharging electrodes while conveying the component in the space.

* * * * *